US012580294B2

(12) United States Patent
Shigematsu et al.

(10) Patent No.: US 12,580,294 B2
(45) Date of Patent: Mar. 17, 2026

(54) WIRELESS MODULE

(71) Applicant: Fujikura Ltd., Tokyo (JP)

(72) Inventors: Noriaki Shigematsu, Sakura (JP);
Masao Mori, Sakura (JP); Kiyoshi Kobayashi, Sakura (JP); Yuki Suto,
Sakura (JP)

(73) Assignee: Fujikura Ltd., Tokyo (JP)

( * ) Notice: Subject to any disclaimer, the term of this
patent is extended or adjusted under 35
U.S.C. 154(b) by 161 days.

(21) Appl. No.: 18/416,484

(22) Filed: Jan. 18, 2024

(65) Prior Publication Data

US 2024/0250401 A1 Jul. 25, 2024

(30) Foreign Application Priority Data

Jan. 23, 2023 (JP) ................................. 2023-008226

(51) Int. Cl.
H01Q 1/02 (2006.01)
H01Q 1/38 (2006.01)
H05K 7/20 (2006.01)

(52) U.S. Cl.
CPC ............. H01Q 1/02 (2013.01); H05K 7/2039
(2013.01)

(58) Field of Classification Search
CPC ...... H01Q 1/2283; H01Q 1/02; H01Q 21/065;
H01Q 1/38; H01Q 1/243; H01Q 23/00;
H01Q 1/2208; H01Q 1/526; H01Q
21/0025; H01Q 9/0407; H01Q 21/06
See application file for complete search history.

(56) References Cited

U.S. PATENT DOCUMENTS

2016/0274216 A1* 9/2016 Minami ................ G01S 13/931
2022/0173494 A1* 6/2022 Bolotov ................... H05K 9/00

FOREIGN PATENT DOCUMENTS

| JP | 4577224 B2 | 11/2010 | |
| JP | WO2020110741 A1 * | 11/2021 | .......... H01Q 21/065 |
| WO | 2020/110741 A1 | 6/2020 | |
| WO | 2022/144983 A1 | 7/2022 | |

OTHER PUBLICATIONS

Title: Radar Device, Author: Yatsumonji Nozomi, Date Nov. 28,
20218, pp. 1-11 (Translation) (Year: 2018).*

* cited by examiner

*Primary Examiner* — Wei (Victor) Y Chan
(74) *Attorney, Agent, or Firm* — WHDA, LLP

(57) ABSTRACT

A wireless module includes: a first substrate including an
antenna that transmits and receives high-frequency signals
in a millimeter-wave band, a first high-temperature element
that supplies high-frequency signals to the antenna being
mounted on the first substrate; and a housing including a
cover and a case combined with each other and housing the
first substrate, the first substrate is in contact with the cover
in an opposing direction in which the case and the cover
oppose each other, the case includes a first heat dissipation
part protruding toward the first high-temperature element, a
first heat dissipation sheet is provided between the first heat
dissipation part and the first high-temperature element in the
opposing direction, and the cover and the first heat dissipa-
tion part compress the first heat dissipation sheet and the first
substrate in the opposing direction.

14 Claims, 12 Drawing Sheets

FIG. 9E

WIRELESS MODULE

BACKGROUND OF THE INVENTION

Field of the Invention

The present disclosure relates to a wireless module.

Description of Related Art

Japanese Patent No. 4577224 (hereinafter, referred to as Patent Document 1) discloses a wireless module that includes a substrate, a heat dissipation sheet, and a housing that houses the substrate and the heat dissipation sheet. An antenna and a power-feeding element (RFIC) that supplies a current to the antenna are mounted on the substrate. The heat dissipation sheet absorbs heat from the power-feeding element (i.e., a high-temperature element) and releases the absorbed heat to the housing.

In general, RF signals in the millimeter-wave band have a large spatial loss. For this reason, a power-feeding element that handles RF signals is required to operate with a high output. Here, as the output of the power-feeding element increases, the amount of heat generated by the power-feeding element increases. Therefore, when the power-feeding element that handles RF signals in the millimeter-wave band is used, it is preferable that a thin heat dissipation sheet be used in order to improve the heat dissipation efficiency. However, in the structure disclosed in Patent Document 1, the positional relationship between the substrate and the housing may vary due to causes such as warping of the substrate or the like. For this reason, when a thin heat dissipation sheet is used, a gap may be created between the heat dissipation sheet and the substrate or between the heat dissipation sheet and the housing, and the heat dissipation from the power-feeding element may not be sufficiently performed.

The present disclosure is made in view of the above circumstances, and an object thereof is to provide a wireless module that can make a heat dissipation sheet thinner even if the positional relationship between a substrate and a housing varies.

SUMMARY OF THE INVENTION

In order to solve the above problems, a wireless module according to an aspect 1 of the present disclosure includes: a first substrate including an antenna that transmits and receives high-frequency signals in a millimeter-wave band, a first high-temperature element that supplies high-frequency signals to the antenna being mounted on the first substrate; and a housing including a cover and a case combined with each other and housing the first substrate, wherein the cover is provided with a passing section allowing electromagnetic waves that the antenna transmits and receives to pass therethrough, the first substrate is in contact with the cover in an opposing direction in which the case and the cover oppose each other, the case includes a first heat dissipation part protruding toward the first high-temperature element, a first heat dissipation sheet is provided between the first heat dissipation part and the first high-temperature element in the opposing direction, and the cover and the first heat dissipation part compress the first heat dissipation sheet and the first substrate in the opposing direction.

According to the aspect 1 of the present disclosure, when the first heat dissipation sheet is made thinner and even if the positional relationship between the first substrate and the housing varies due to warping of the first substrate or the like, the compression force of the cover and the case can bring the first heat dissipation sheet into contact with the first high-temperature element and the first heat dissipation part. As a result, the first heat dissipation sheet can dissipate heat from the first high-temperature element to the case.

An aspect 2 of the present disclosure is that in the wireless module of the aspect 1, no heat transfer members are provided between the case and parts other than the first high-temperature element among parts provided in the first substrate in the opposing direction.

An aspect 3 of the present disclosure is that in the wireless module of the aspect 1 or 2, the cover and the case are made of metal.

An aspect 4 of the present disclosure is that in the wireless module of the aspect 3, the first high-temperature element is surrounded by the case and a GND of the first substrate.

An aspect 5 of the present disclosure is that in the wireless module of any one of the aspects 1 to 4, an area of the first heat dissipation sheet is less than an area of the first high-temperature element when viewed in the opposing direction.

An aspect 6 of the present disclosure is that in the wireless module of any one of the aspects 1 to 5, an area of a tip surface of the first heat dissipation part is greater than an area of the first heat dissipation sheet when viewed in the opposing direction.

An aspect 7 of the present disclosure is that in the wireless module of any one of the aspects 1 to 6, the first heat dissipation part includes a tapered portion having a tapered shape in which a cross-sectional area thereof gradually decreases in a direction from the case toward the first high-temperature element.

An aspect 8 of the present disclosure is that in the wireless module of any one of the aspects 1 to 7, a portion of the cover that is in contact with the first substrate does not interfere with a Fresnel zone of the antenna.

An aspect 9 of the present disclosure is that in the wireless module of any one of the aspects 1 to 8, the first heat dissipation sheet has a radio wave-absorbing property.

An aspect 10 of the present disclosure is that the wireless module of any one of the aspects 1 to 9 further includes a second substrate that handles baseband signals having a lower frequency than that of the high-frequency signals, wherein the housing houses the first substrate and the second substrate.

An aspect 11 of the present disclosure is that in the wireless module of the aspect 10, a second high-temperature element that supplies baseband signals to the first high-temperature element is mounted on the second substrate, the case includes a second heat dissipation part protruding toward the second high-temperature element, and a second heat dissipation sheet is provided between the second heat dissipation part and the second high-temperature element in the opposing direction.

An aspect 12 of the present disclosure is that in the wireless module of the aspect 11, the second heat dissipation sheet is thicker than the first heat dissipation sheet.

An aspect 13 of the present disclosure is that in the wireless module of any one of the aspects 10 to 12, the first substrate is fixed to the cover, and the second substrate is fixed to the case.

An aspect 14 of the present disclosure is that in the wireless module of any one of the aspects 10 to 13, the second substrate is provided with an external terminal, parts other than the antenna and the external terminal among parts provided in the first substrate or the second substrate are positioned between the case and the cover in the opposing direction, and parts other than the antenna and the external terminal among parts provided in the first substrate or the second substrate overlap both of the case and the cover when viewed in the opposing direction.

According to the above aspects of the present disclosure, it is possible to provide a wireless module that can make a heat dissipation sheet thinner even if the positional relationship between a substrate and a housing varies.

BRIEF DESCRIPTION OF THE DRAWINGS

FIG. 9E is a diagram showing a state following FIG. 9D.

DETAILED DESCRIPTION OF THE INVENTION

A wireless module according to an embodiment of the present disclosure is described below based on the drawings.

Figure 1:
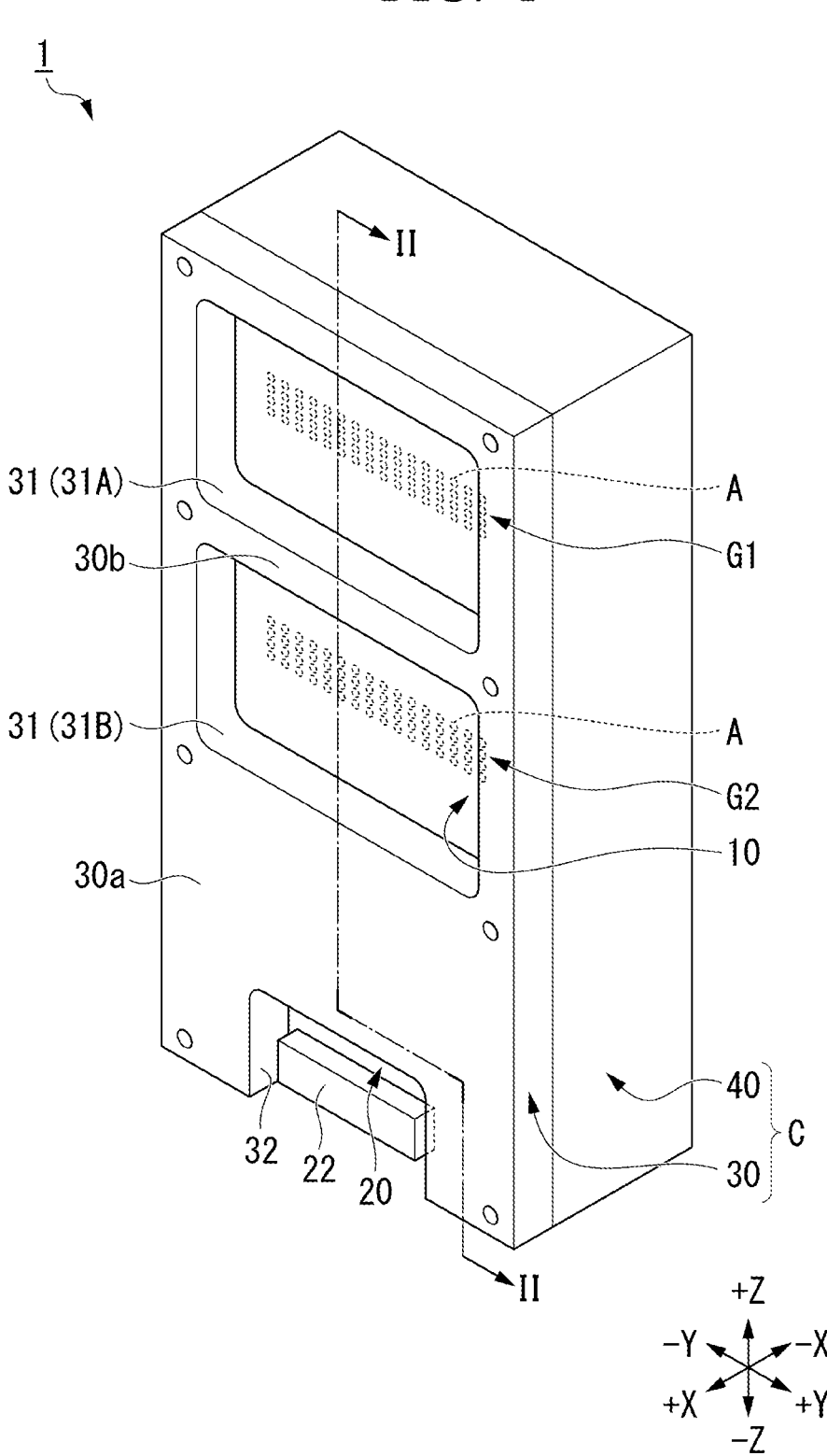
FIG. 1 is a perspective view showing a wireless module according to an embodiment of the present disclosure.
Figure 2:
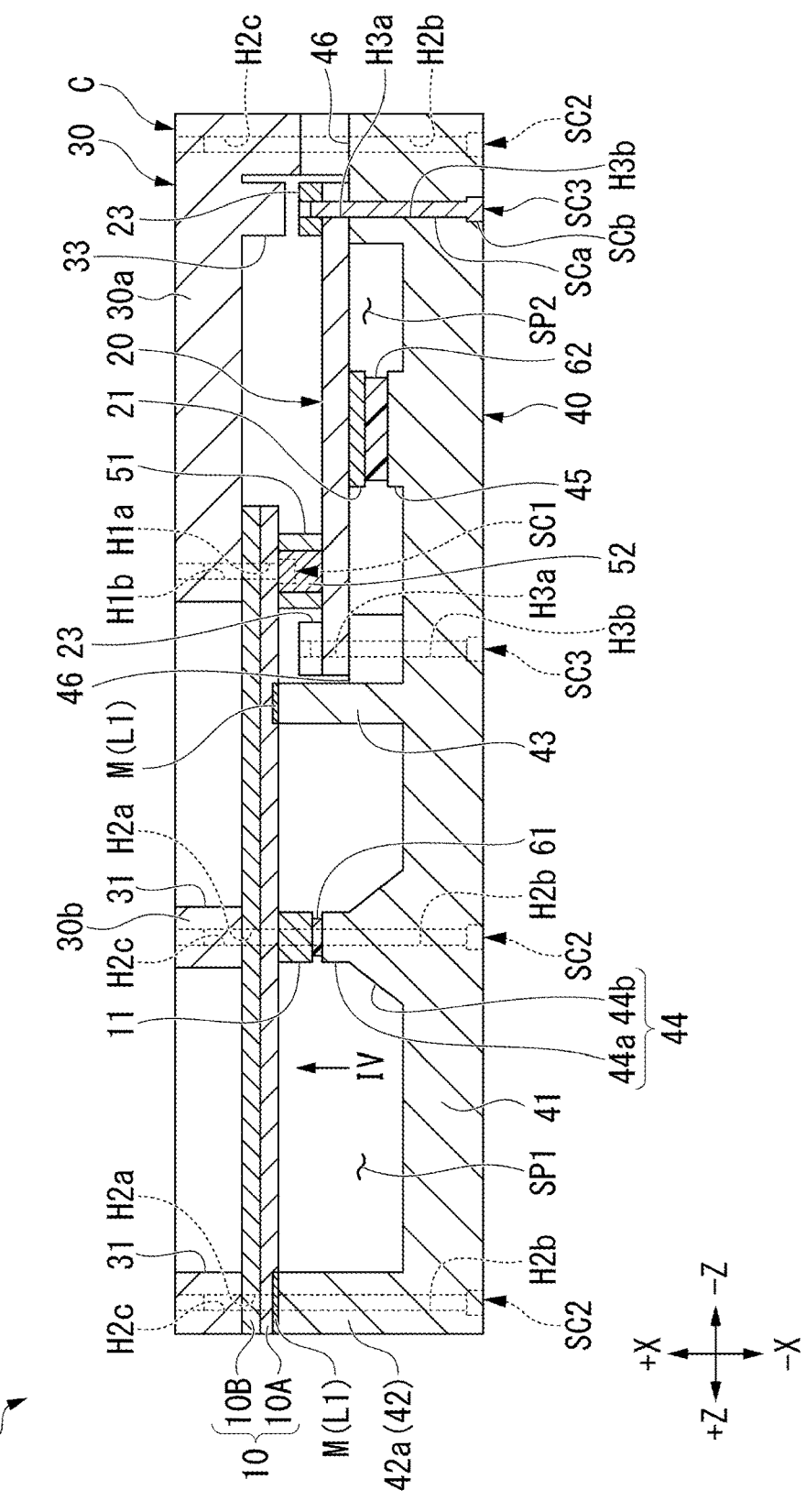
FIG. 2 is a cross-sectional view taken along line II-II shown in FIG. 1.

As shown in FIGS. 1 and 2, a wireless module 1 according to the present embodiment includes a first substrate 10, a second substrate 20, and a housing C. The housing C includes a cover 30 and a case 40. The cover 30 and the case 40 are combined with each other in a thickness direction of the housing C. The housing C houses the first substrate 10 and the second substrate 20. The housing C according to the present embodiment has a substantially rectangular outer shape in plan view viewed in the thickness direction of the housing C. The housing C (i.e., the cover 30 and the case 40) is made of metal such as aluminum, stainless steel or the like. The first substrate 10 includes a plurality of antennas A. Each antenna A transmits and receives high-frequency signals (RF signals) in the millimeter-wave band.
(Direction Definition)

Here, in the present embodiment, a direction in which the cover 30 and the case 40 oppose each other is referred to as an opposing direction X. In the present embodiment, the opposing direction X is also the thickness direction of the housing C. Viewing in the opposing direction X is referred below to as plan view. One direction that crosses (for example, is orthogonal to) the opposing direction X is referred to as a first direction Y. In the present embodiment, the first direction Y is also a direction in which the short side of the housing C extends in plan view. A direction that crosses (for example, is orthogonal to) both of the opposing direction X and the first direction Y is referred to as a second direction Z. In the present embodiment, the second direction Z is also a direction in which the long side of the housing C extends in plan view. A direction from the case 40 toward the cover 30 parallel to the opposing direction X is referred to as front side and is represented by +X direction in the drawings. A direction from the cover 30 toward the case 40 parallel to the opposing direction X is referred to as back side and is represented by −X direction in the drawings. One direction parallel to the first direction Y is referred to as a right direction and is represented by +Y direction in the drawings. The opposite direction to the +Y direction is referred to as a left direction and is represented by −Y direction in the drawings. One direction parallel to the second direction Z is referred to as an upward direction and is represented by +Z direction in the drawings. The opposite direction to the +Z direction is referred to as a downward direction and is represented by −Z direction in the drawings.

As shown in FIG. 1, the cover 30 according to the present embodiment includes a plate portion 30a, a beam portion 30b, two passing sections 31, and a terminal hole 32. The plate portion 30a has a plate shape extending in the first direction Y and the second direction Z.

The passing sections 31 are sections that allow electromagnetic waves that the antennas A transmit and receive to pass therethrough. In other words, the passing sections 31 are sections that prevent the electromagnetic waves from electromagnetically interfering with the cover 30 (i.e., the plate portion 30a). As shown in FIGS. 1 and 2, the passing sections 31 according to the present embodiment are holes (i.e., openings) that penetrate the plate portion 30a in the opposing direction X. In the present embodiment, the two passing sections 31 are disposed at intervals in the second direction Z. The two passing sections 31 are referred below to as a first passing section 31A and a second passing section 31B. The first passing section 31A is positioned above the second passing section 31B. However, the passing sections 31 are not limited to the through-holes (i.e., the openings). As long as the cover 30 allows the electromagnetic waves that the antennas A transmit and receive to pass therethrough, the configuration of the passing section 31 can be changed as appropriate.

As shown in FIG. 1, the positions of the two passing sections 31 correspond to the positions of two antenna groups G1 and G2 (described below) that the first substrate 10 includes. That is, the position of the first passing section 31A corresponds to the position of the first antenna group G1, and the position of the second passing section 31B corresponds to the position of the second antenna group G2.

The beam portion 30b is a portion of the cover 30 positioned between the two passing sections 31. The beam portion 30b according to the present embodiment linearly extends in the first direction Y. The beam portion 30b separates the two passing sections 31 in the second direction Z. As shown in FIG. 2, the beam portion 30b is in contact with the first substrate 10 in the opposing direction X.

As shown in FIG. 1, the terminal hole 32 according to the present embodiment is provided in the lower end portion of the cover 30 (i.e., the plate portion 30a). The terminal hole 32 penetrates the plate portion 30a in the opposing direction X and opens downward. The terminal hole 32 corresponds to the position of an external terminal 22 (described below) provided in the second substrate 20.

Figure 3:
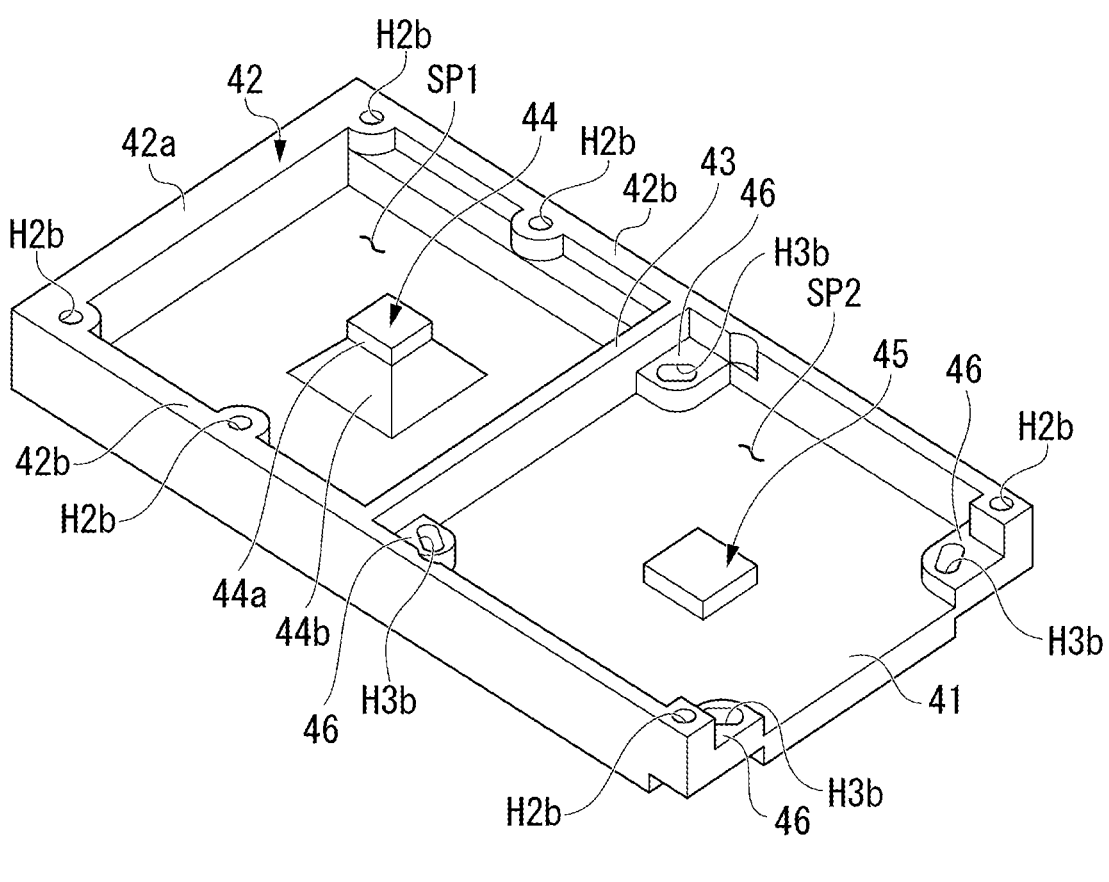
FIG. 3 is a perspective view showing a case according to the embodiment of the present disclosure.
Figure 3:
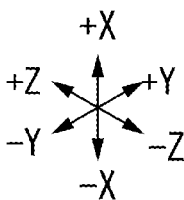

As shown in FIGS. 2 and 3, the case 40 according to the present embodiment includes a base portion 41, a peripheral wall portion 42, a partition portion 43, a first heat dissipation part 44, a second heat dissipation part 45, and a plurality (four in the example shown in the drawings) of pedestal portions 46. As shown in FIG. 3, the base portion 41 has a plate shape extending in the first direction Y and the second direction Z.

The peripheral wall portion 42 extends from the outer peripheral edge of the base portion 41 toward the front side (+X side). In other words, the peripheral portion wall 42 is erected on the outer peripheral edge of the base portion 41. The peripheral wall portion 42 according to the present embodiment has a U-shape that is convex toward the upper side (+Z side) in plan view. Specifically, the peripheral wall portion 42 according to the present embodiment includes a top portion 42a and a pair of side portions 42b. The top portion 42a extends along the short side on the upper side (+Z side) of the base portion 41. Each side portion 42b extends along the long side of the base portion 41.

The partition portion 43 is erected on a central portion of the base portion 41. The partition portion 43 extends in the first direction Y and connects central portions of the two side portions 42b to each other. As a result, the partition portion 43 partitions the space surrounded by the base portion 41 and the peripheral wall portion 42 into an upper space SP1 and a lower space SP2. The upper space SP1 is a space positioned on the upper side (+Z side) of the partition portion 43. The upper space SP1 is surrounded by the top portion 42a, the pair of side portions 42b, and the partition portion 43. The lower space SP2 is a space positioned on the lower side (−Z side) of the partition portion 43. The lower space SP2 is surrounded by the pair of side portions 42b and the partition portion 43.

As shown in FIG. 3, the first heat dissipation part 44 is positioned in a central portion of the upper space SP1 in plan view. The first heat dissipation part 44 has a shape protruding from the base portion 41 toward the front side (+X side). Specifically, the first heat dissipation part 44 according to the present embodiment includes a contact portion 44a and a tapered portion 44b. The tapered portion 44b is provided on the front side end surface (+X side surface) of the base portion 41. The tapered portion 44b has a tapered shape in which the cross-sectional area thereof gradually decreases in a direction from the back side (−X side) toward the front side (+X side). The contact portion 44a is provided in the tip portion of the tapered portion 44b. As shown in FIG. 2, a first heat dissipation sheet 61 is in contact with the tip surface of the contact portion 44a.

As shown in FIG. 3, the second heat dissipation part 45 is positioned in a central portion of the lower space SP2 in plan view. The second heat dissipation part 45 has a shape protruding from the base portion 41 toward the front side (+X side). In the present embodiment, as shown in FIG. 2, the amount by which the second heat dissipation part 45 protrudes from the base portion 41 is less than the amount by which the first heat dissipation part 44 protrudes from the base portion 41. In other words, in the opposing direction X, the distance between the tip surface (i.e., the front side end surface, +X side surface) of the second heat dissipation part 45 and the base portion 41 is less than the distance between the tip surface (i.e., the front side end surface, +X side surface) of the first heat dissipation part 44 and the base portion 41. As shown in FIG. 2, a second heat dissipation sheet 62 is in contact with the tip surface of the second heat dissipation part 45.

As shown in FIG. 3, the four pedestal portions 46 are positioned at four corners that the lower space SP2 has in plan view. Each pedestal portion 46 has a shape protruding from the base portion 41 toward the front side (+X side). The amount by which the pedestal portion 46 protrudes from the base portion 41 is less than the amount by which the peripheral wall portion 42 protrudes from the base portion 41. In other words, in the opposing direction X, the distance between the tip surface (i.e., the front side end surface, +X side surface) of the pedestal portion 46 and the base portion 41 is less than the distance between the tip surface (i.e., the front side end surface, +X side surface) of the peripheral wall portion 42 and the base portion 41. As shown in FIG. 2, the second substrate 20 is in contact with the tip surfaces of the pedestal portions 46.

Figure 4:
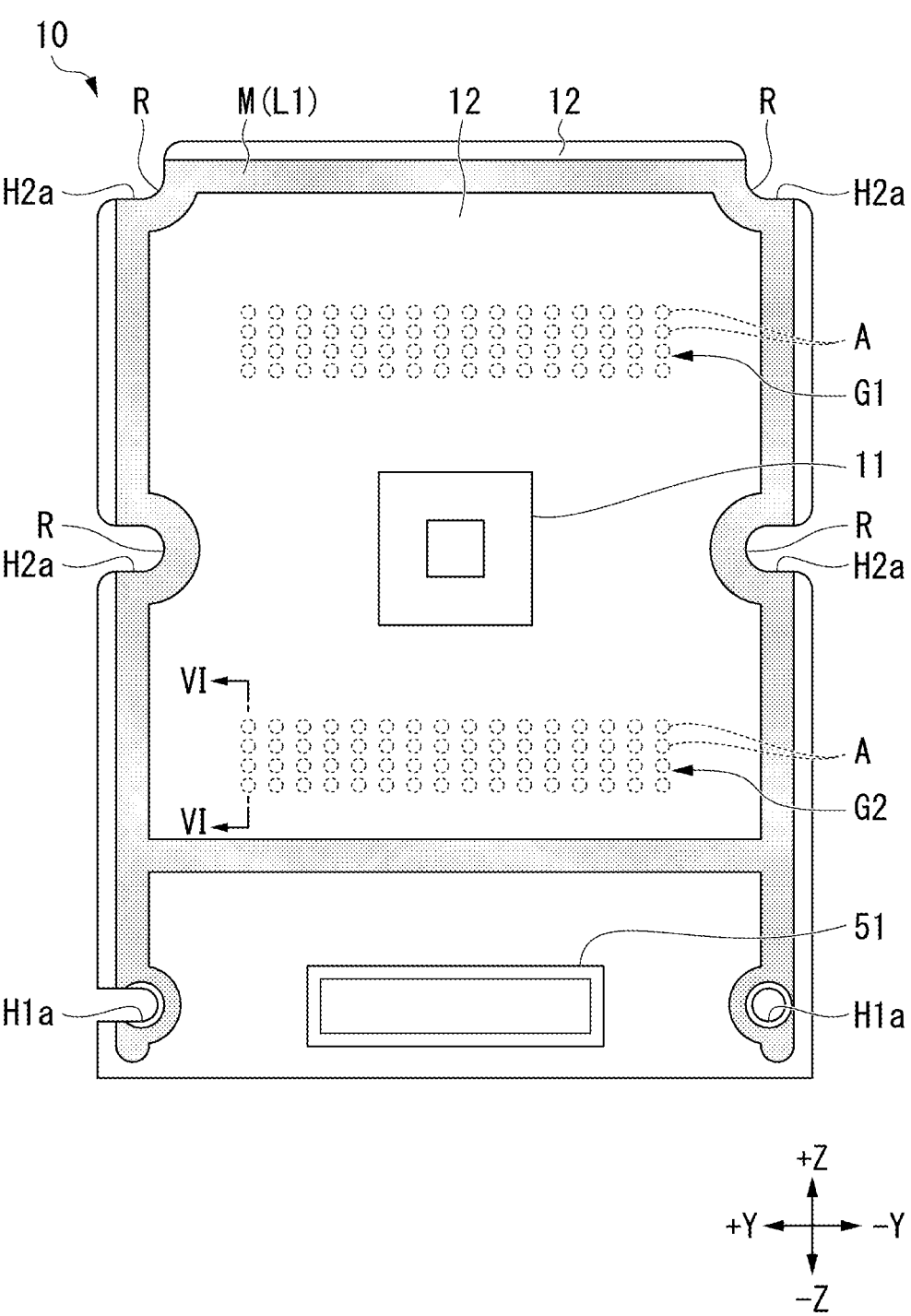
FIG. 4 is a view of a first substrate shown in FIG. 2 as viewed in an arrow IV direction.

As shown in FIG. 4, a first power-feeding element (first high-temperature element) 11 is mounted on the first substrate 10. In the present embodiment, the plurality of antennas A constitute two antenna groups including the first antenna group G1 and the second antenna group G2. The first antenna group G1 and the second antenna group G2 are disposed such that the first power-feeding element 11 is arranged therebetween in the second direction Z.

Each antenna A belonging to the first antenna group G1 is, for example, a transmission antenna that transmits electromagnetic waves to the outside of the wireless module 1. Each antenna A belonging to the second antenna group G2 is, for example, a reception antenna that receives electromagnetic waves from the outside of the wireless module 1. The arrangement and function of each antenna A can be changed as appropriate. For example, each antenna A belonging to the first antenna group G1 may be the reception antenna, and each antenna A belonging to the second antenna group G2 may be the transmission antenna. The wireless module 1 may include only one or three or more antenna groups.

The first power-feeding element 11 supplies high-frequency signals (RF signals) to each antenna A. Specifically, the first power-feeding element 11 supplies the high-frequency signals (RF signals) to each antenna A through a signal layer L1 (described below) and the like. For the first power-feeding element 11, for example, an RFIC (Radio Frequency Integrated Circuit) or the like can be used. The first substrate 10 is also referred to as an RFIC substrate or an RF substrate. Although detailed illustrations are omitted, peripheral components other than the first power-feeding element 11 and the antennas A may be mounted on the first substrate 10.

Figure 5:
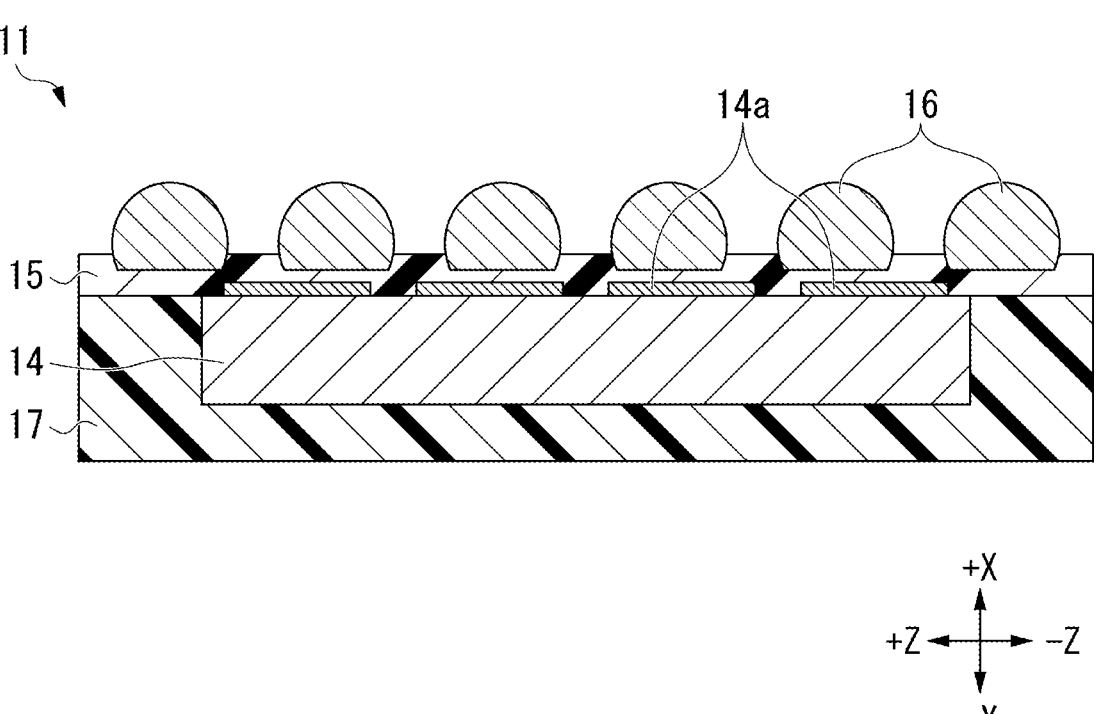
FIG. 5 is a diagram showing an example of the structure of a first power-feeding element according to the embodiment of the present disclosure.

FIG. 5 is a diagram showing an example of the structure of the first power-feeding element 11. The first power-feeding element 11 shown in the example of the drawing has a fan-out package structure. Specifically, the first power-feeding element 11 includes a main body part 14, a rewiring layer 15, a plurality of solder bumps 16, and a sealing resin 17.

The main body part 14 processes the high-frequency signals (RF signals). The front side (+X side) end surface of the main body part 14 is provided with a plurality of terminals 14a. The sealing resin 17 covers the main body part 14 from the back side (−X side) and in directions (i.e., the first direction Y and the second direction Z) crossing the opposing direction X. The rewiring layer 15 is stacked on the front side (+X side) of the main body part 14 and the sealing resin 17. The rewiring layer 15 is, for example, an insulating layer. The plurality of solder bumps 16 are provided on the rewiring layer 15. The solder bumps 16 are exposed on the front side (+X side) end surface of the rewiring layer 15. The terminal 14a and the solder bump 16 are electrically connected together by a conductor (rewiring) not shown provided in the rewiring layer 15. Although detailed illustrations are omitted, each solder bump 16 is bonded to the first substrate 10, so that the first power-feeding element 11 is mounted on the first substrate 10. The sealing resin 17 may not cover the back side (−X side) of the main body part 14. In this case, heat dissipation from the main body part 14 can be promoted.

Figure 6:
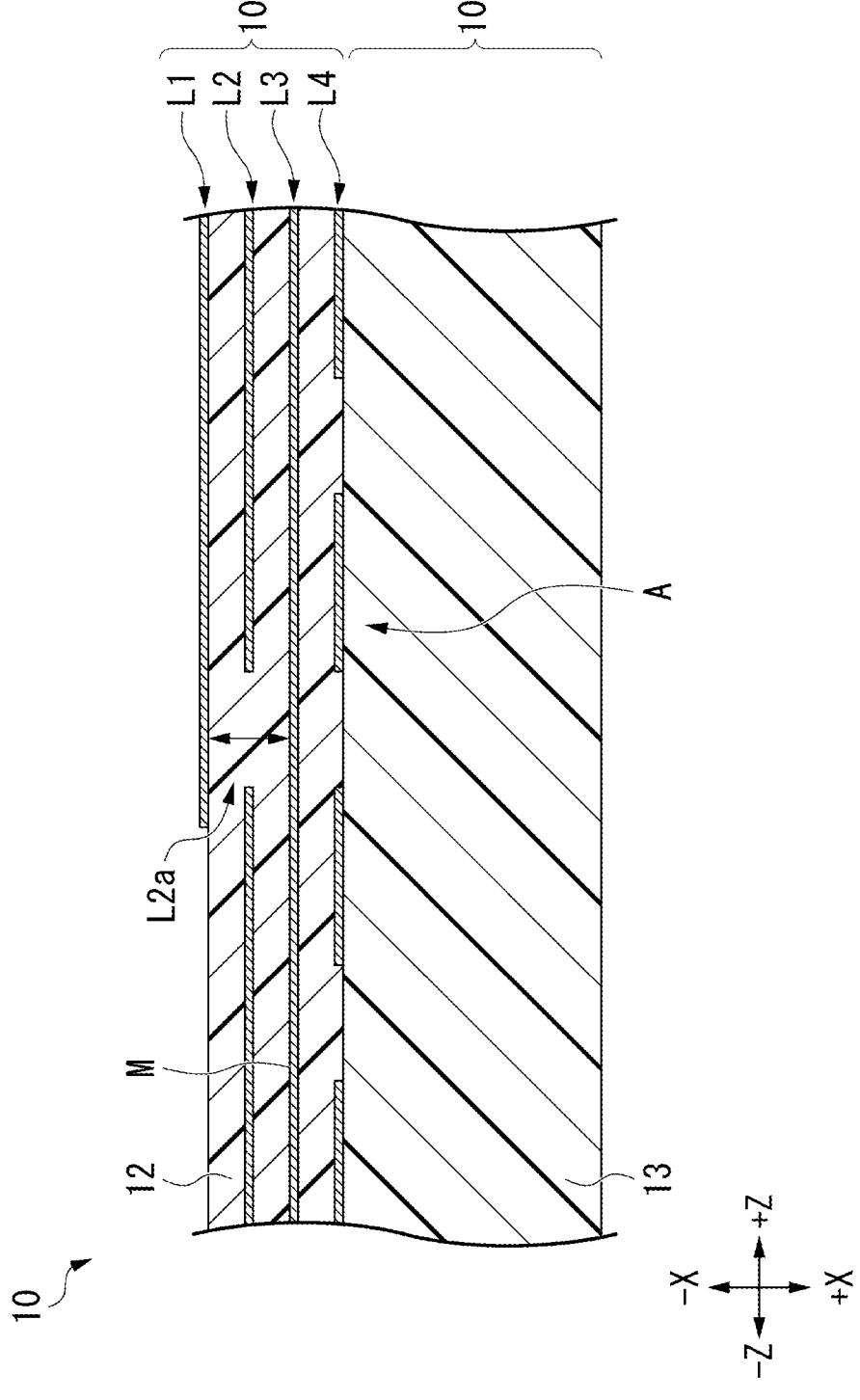
FIG. 6 is a cross-sectional view taken along line V-V shown in FIG. 4.

As shown in FIGS. 2 and 6, the first substrate 10 according to the present embodiment has a structure in which a main part 10A and a reinforcement part 10B are stacked together in the opposing direction X. As shown in FIGS. 2 and 6, the reinforcement part 10B is stacked on the front side (+X side) of the main part 10A. The first power-feeding element 11 described above is mounted on the main part 10A as shown in FIG. 2.

As shown in FIG. 6, the main part 10A according to the present embodiment is a multilayer substrate including four layers L1 to L4 that are disposed at intervals in the opposing direction X. An insulator 12 is filled between two layers next to each other of the four layers L1 to L4. The main part 10A is, for example, an LCP (Liquid Crystal Polymer) substrate.

Specifically, the main part 10A includes a signal layer L1, a GND layer L2, a first antenna layer L3, and a second antenna layer L4. The signal layer L1, the GND layer L2, the first antenna layer L3, and the second antenna layer L4 are disposed in this order in a direction from the back side (−X side) toward the front side (+X side). The second antenna layer L4 is in contact with the reinforcement part 10B. A layered metal portion (conductor portion) M is disposed in each of the layers L1 to L4.

The plurality of antennas A are disposed in the first antenna layer L3 and the second antenna layer L4 at intervals in the first direction Y and the second direction Z. Specifically, the metal portion M (radiating element) disposed in the first antenna layer L3 and the metal portion M (parasitic element) disposed in the second antenna layer L4 constitute the plurality of antennas A. The signal layer L1 is electrically connected to the first power-feeding element 11 and performs transmission and reception of the high-frequency signals (RF signals) with the first power-feeding element 11 when the antenna A transmits and receives the electromagnetic waves. Here, the signal layer L1 and the first antenna layer L3 according to the present embodiment are electromagnetically coupled (for example, capacitively coupled) via an opening L2a provided in the GND layer L2. Through the electromagnetic coupling, each antenna A can transmit the electromagnetic waves by the high-frequency signals output from the first power-feeding element 11 and can output the received electromagnetic waves to the first power-feeding element 11.

The reinforcement part 10B reinforces the main part 10A and protects the antennas A. The reinforcement part 10B according to the present embodiment is a thin plate-shaped member formed of a low loss dielectric 13. The material of the low loss dielectric 13 and the dimensions (e.g., thickness) of the reinforcement part 10B are preferably selected so as not to adversely affect transmission and reception of the electromagnetic waves by the antennas A. The reinforcement part 10B may have a role of improving the gain of the electromagnetic waves.

The first substrate 10 extends in the first direction Y and the second direction Z. The first substrate 10 according to the present embodiment is fixed to the housing C such that the first substrate 10 is sandwiched between the cover 30 and the case 40 in the opposing direction X as shown in FIG. 2. More specifically, the first substrate 10 according to the present embodiment is sandwiched between the cover 30 and the peripheral wall portion 42 and the partition portion 43 of the case 40 in the opposing direction X. As a result, the first substrate 10 closes the upper space SP1 of the case 40.

The metal portion M is exposed on at least a portion of the surface of the first substrate 10 (i.e., the main part 10A). In the present embodiment, the metal portion M is exposed on a portion of the first substrate 10 that is in contact with the case 40 (i.e., the peripheral wall portion 42 and the partition portion 43). As a result, the metal portion M of the first substrate 10 is in mechanical and electrical contact with the case 40. Specifically, as shown in FIGS. 2 and 4, the metal portion M is exposed on portions of the first substrate 10 that are in contact with the top portion 42a, the side portions 42b, and the partition portion 43. The metal portion M exposed on the surface of the first substrate 10 and being in contact with the case 40 is, for example, a GND (so-called solid pattern, solid GND) of the signal layer L1 (refer to FIG. 6). In FIG. 2, for ease of viewing, illustrations of portions of the layers L1 to L4 other than the above contact portions are omitted. However, the GND (solid GND) of the layers L2 to L4 may be exposed on the surface of the first substrate 10 and may be in contact with the case 40. In this case, the insulator 12 may be appropriately removed from the surface of the first substrate 10.

The first power-feeding element 11 according to the present embodiment is surrounded by the case 40 and the GND (solid GND) of the first substrate 10. Specifically, the first power-feeding element 11 is positioned between the base portion 41 of the case 40 and the GND of the first substrate 10 in the opposing direction X. The first power-feeding element 11 is positioned between the two side portions 42b of the case 40 in the first direction Y (also refer to FIG. 3). The first power-feeding element 11 is positioned between the top portion 42a and the partition portion 43 of the case 40 in the second direction Z (refer to FIG. 2). In this way, the first power-feeding element 11 is surrounded by the case 40 and the GND of the first substrate 10 in three directions of the opposing direction X, the first direction Y, and the second direction Z. The GND of the first substrate 10 that surrounds the first power-feeding element 11 together with the case 40 may be the GND of the signal layer L1, the GND of the GND layer L2, the GND of the first antenna layer L3, the GND of the second antenna layer L4, or a combination thereof.

As shown in FIGS. 2 and 4, the first substrate 10 includes a first connector 51. In other words, the first connector 51 is mounted on the first substrate 10. The first connector 51 is provided in the lower end portion (−Z side end portion) of the first substrate 10. As shown in FIG. 2, the first connector 51 extends from the lower end portion (−Z side end portion) of the first substrate 10 toward the back side (−X side). The second substrate 20 includes a second connector 52. In other words, the second connector 52 is mounted on the second substrate 20. As shown in FIG. 2, the second connector 52 extends from the upper end portion (+Z side end portion) of the second substrate 20 toward the front side (+X side).

The first connector 51 and the second connector 52 are inter-substrate connectors that electrically connect the first substrate 10 and the second substrate 20. Specifically, the first connector 51 and the second connector 52 are electrically directly connected, so that the first substrate 10 and the second substrate 20 are electrically connected together. In other words, the first connector 51 and the second connector 52 are mechanically and electrically connected, the first substrate 10 and the second substrate 20 are electrically connected together. In a state where the first substrate 10 and the second substrate 20 are electrically connected, the first connector 51 and the second connector 52 are positioned in the lower space SP2 described above. The first connector 51 may be a male connector and the second connector 52 may be a female connector, or the first connector 51 may be a female connector and the second connector 52 may be a male connector.

The second substrate 20 is a substrate that handles baseband signals having a lower frequency than that of the high-frequency signals that the antennas A of the first substrate 10 transmit and receive. The second substrate 20 is also referred to as a baseband substrate or a BB substrate. The second substrate 20 is, for example, a glass-epoxy substrate.

As shown in FIG. 2, the second substrate 20 is electrically connected to the first substrate 10 through the first connector 51 and the second connector 52. The second substrate 20 extends in the first direction Y and the second direction Z. The second substrate 20 and the first substrate 10 are disposed in different positions in the opposing direction X. Specifically, in the opposing direction X, the distance between the second substrate 20 and the base portion 41 is less than the distance between the first substrate 10 and the base portion 41. In plan view, the first substrate 10 and the second substrate 20 at least partially overlap each other. More specifically, in the example shown in the drawing, the lower end portion (−Z side end portion) of the first substrate 10 and the upper end portion (+Z side end portion) of the second substrate 20 overlap each other in plan view. The first connector 51 and the second connector 52 are provided in the overlapping portions of the two substrates 10 and 20.

As shown in FIGS. 1 and 2, the second substrate 20 according to the present embodiment is provided with a second power-feeding element (second high-temperature element) 21 and the external terminal 22. The external terminal 22 is, for example, a terminal for supplying power to the first substrate 10 and the second substrate 20. As shown in FIG. 1, the external terminal 22 is exposed to the outside of the housing C through the terminal hole 32 of the cover 30.

The second power-feeding element 21 supplies baseband signals (BB signals) to the first power-feeding element 11 through the first connector 51 and the second connector 52 (refer to FIG. 2). For the second power-feeding element 21, for example, a BBIC (Base Band Integrated Circuit) or the like can be used. Although detailed illustrations are omitted, peripheral components other than the second power-feeding element 21 and the external terminal 22 may be mounted on the second substrate 20.

The second power-feeding element 21 may have a fan-out package structure similar to the first power-feeding element 11. That is, the second power-feeding element 21 may include a main body part, a rewiring layer, a plurality of solder bumps, and a sealing resin similar to the first power-feeding element 11 (refer to FIG. 5).

As shown in FIG. 2, the first heat dissipation sheet 61 is disposed between the first heat dissipation part 44 (i.e., the contact portion 44a) and the first power-feeding element 11 in the opposing direction X. The first heat dissipation sheet 61 is in contact with both of the first power-feeding element 11 and the first heat dissipation part 44 (i.e., the contact portion 44a) in the opposing direction X. The first heat dissipation sheet 61 absorbs heat from the first power-feeding element 11 and dissipates the absorbed heat to the first heat dissipation part 44.

The first heat dissipation sheet 61 may have a radio wave-absorbing property. More specifically, the first heat dissipation sheet 61 may have a radio wave-absorbing property in a range from the centimeter-wave band to the millimeter-wave band. An example of the first heat dissipation sheet 61 having the radio wave-absorbing property includes an EMI countermeasure sheet or the like.

As shown in FIG. 2, the second heat dissipation sheet 62 is disposed between the second heat dissipation part 45 and the second power-feeding element 21 in the opposing direction X. The second heat dissipation sheet 62 is in contact with both of the second power-feeding element 21 and the second heat dissipation part 45 in the opposing direction X. The second heat dissipation sheet 62 absorbs heat from the second power-feeding element 21 and dissipates the absorbed heat to the second heat dissipation part 45. The thickness of the second heat dissipation sheet 62 in the opposing direction X may be greater than the thickness of the first heat dissipation sheet 61 in the opposing direction X. That is, the second heat dissipation sheet 62 may be thicker than the first heat dissipation sheet 61. The second heat dissipation sheet 62 may come into contact with peripheral components (power IC or the like) provided in the second substrate 20 to absorb heat therefrom and may dissipate the heat absorbed from the peripheral components to the second heat dissipation part 45.

In plan view, the area of the first heat dissipation sheet 61 may be less than the area of the first power-feeding element 11. Specifically, the size of the first heat dissipation sheet 61 may correspond to the size of the main body part 14 (refer to FIG. 5) of the first power-feeding element 11. According to this configuration, while the main body part 14, which is a portion of the first power-feeding element 11 that mainly generates heat, is cooled, it is possible to limit the amount of use of the first heat dissipation sheet 61 to reduce the costs. Similarly, in plan view, the area of the second heat dissipation sheet 62 may be less than the area of the second power-feeding element 21. Specifically, the size of the second heat dissipation sheet 62 may correspond to the size of the main body part of the second power-feeding element 21.

In plan view, the area of the tip surface (i.e., front side end surface, +X side surface) of the first heat dissipation part 44 (i.e., the contact portion 44a) may be greater than the area of the first heat dissipation sheet 61. In plan view, the area of the tip surface (i.e., front side end surface, +X side surface) of the second heat dissipation part 45 may be greater than the area of the second heat dissipation sheet 62.

In the present embodiment, parts other than the first power-feeding element 11 among parts provided in the first substrate 10 do not dissipate heat to the case 40. That is, parts other than the first power-feeding element 11 among parts provided in the first substrate 10 are not in thermal contact with the case 40. The "parts other than the first power-feeding element 11 among parts provided in the first substrate 10" include, for example, peripheral components or the like mounted on the first substrate 10.

The first substrate 10, the second substrate 20, the cover 30, and the case 40 described above are fixed to each other by positioning screws SC1, through screws SC2, and fixing screws SC3 as shown in FIG. 2. Each of the screws SC1 to SC3 includes a screw portion SCa and a head portion SCb fixed to one end of the screw portion SCa. The outer peripheral surface of the screw portion SCa is provided with a spiral protrusion. The head portion SCb has a greater diameter than that of the screw portion SCa. A fixing structure using the screws SC1 to SC3 is described below.

The positioning screws SC1 position and fix the first substrate 10 to the cover 30. As shown in FIG. 4, the first substrate 10 according to the present embodiment includes a plurality (two in the example shown in the drawing) of positioning holes H1a. In the present embodiment, each positioning hole H1$a$ is positioned in the outer peripheral portion of the first substrate 10 in plan view. The positioning hole H1$a$ is a hole for positioning and fixing the first substrate 10 to the cover 30. Each positioning hole H1$a$ penetrates the first substrate 10 in the opposing direction X. The positioning screw SC1 is inserted through each positioning hole H1$a$. In the present embodiment, two positioning holes H1$a$ are provided in the vicinity of the first connector 51. One of the two positioning holes H1$a$ opens at the outer peripheral edge of the first substrate 10.

As shown in FIG. 2, the cover 30 includes first screw holes H1$b$ into which the positioning screws SC1 are inserted. Although detailed illustrations are omitted, the cover 30 includes the same number of the first screw holes H1$b$ as that of the positioning holes H1$a$. The positions of the first screw holes H1$b$ correspond to the positions of the positioning holes H1$a$. The inner peripheral surface of the first screw hole H1$b$ is provided with a spiral groove that threadably engages with the outer peripheral surface of the screw portion SCa.

When the first substrate 10 is positioned and fixed to the cover 30, the screw portion SCa of the positioning screw SC1 is inserted through the positioning hole H1$a$ and is screwed into the first screw hole H1$b$. Then, the head portion SCb of the positioning screw SC1 eventually comes into contact with the first substrate 10. When the positioning screw SC1 is further screwed, the head portion SCb presses the first substrate 10 against the cover 30. The first substrate 10 is fixed to the cover 30 due to the pressing force in a state of being in contact with the cover 30. More specifically, the first substrate 10 according to the present embodiment is fixed to the cover 30 in a state of being in surface contact with the cover 30. The first substrate 10 according to the present embodiment is not screw fixed to the case 40.

The through screws SC2 fix the case 40 to the cover 30. As shown in FIG. 3, the case 40 according to the present embodiment includes a plurality (six in the example shown in the drawing) of through-holes H2$b$. Each through-hole H2$b$ penetrates the case 40 in the opposing direction X. The through screw SC2 is inserted through each through-hole H2$b$. In the present embodiment, each through-hole H2$b$ is provided in the peripheral wall portion 42 of the case 40.

As shown in FIG. 2, the cover 30 includes second screw holes H2$c$ into which the through screws SC2 are inserted. Although detailed illustrations are omitted, the cover 30 includes the same number of the second screw holes H2$c$ as that of the through-holes H2$b$. The positions of the second screw holes H2$c$ correspond to the positions of the through-holes H2$b$. The inner peripheral surface of the second screw hole H2$c$ is provided with a spiral groove that threadably engages with the outer peripheral surface of the screw portion SCa.

Here, as described above, the first substrate 10 according to the present embodiment is sandwiched between the cover 30 and the peripheral wall portion 42 of the case 40 in the opposing direction X. In the present embodiment, the through-holes H2$b$ are provided in the peripheral wall portion 42, so the through screws SC2 do not penetrate only the cover 30 and the case 40 but also penetrate the first substrate 10.

As shown in FIG. 4, the first substrate 10 includes avoidance portions H2$a$. The avoidance portions H2$a$ are holes for preventing interference (structural interference) between the through screws SC2 and the first substrate 10. The positions of the avoidance portions H2$a$ correspond to the positions of the through-holes H2$b$ and the second screw holes H2$c$. Each avoidance portion H2$a$ penetrates the first substrate 10 in the opposing direction X. In the present embodiment, each avoidance portion H2$a$ opens at the outer peripheral edge of the first substrate 10. The size (i.e., the area in plan view) of each avoidance portion H2$a$ is greater than the size of the positioning hole H1$a$. More specifically, each avoidance portion H2$a$ has an arc R with a greater radius of curvature than the radius of the positioning hole H1$a$ in plan view.

When the case 40 is fixed to the cover 30, the screw portion SCa of the through screw SC2 is inserted through the through-hole H2$b$ and is screwed into the second screw hole H2$c$. Then, the head portion SCb of the through screw SC2 eventually comes into contact with the case 40. When the through screw SC2 is further screwed, the head portion SCb presses the case 40 and the first substrate 10 against the cover 30. The pressing force fixes the case 40 to the cover 30. The case 40 presses the first substrate 10 against the cover 30, so that the first substrate 10 is more firmly fixed to the cover 30. That is, the through screws SC2 also have a role of making the first substrate 10 more firmly fixed to the cover 30.

The screw portion SCa of the through screw SC2 is screwed into the second screw hole H2$c$, and the head portion SCb presses the case 40, so that the cover 30 and the first heat dissipation part 44 compress the first heat dissipation sheet 61 and the first substrate 10 in the opposing direction X. In other words, the cover 30 and the first heat dissipation part 44 apply a compressive force in the opposing direction X to the first heat dissipation sheet 61 and the first substrate 10. As a result, the thickness (i.e., the dimension in the opposing direction X) of the first heat dissipation sheet 61 is less than that in the natural state. The term "natural state" means a state where no force (no compressive force) is applied to the first heat dissipation sheet 61.

In order to compress the first heat dissipation sheet 61 and the first substrate 10 in this way, the following dimensional relationship is established in the present embodiment. That is, a gap in the opposing direction X formed between the first power-feeding element 11 and the first heat dissipation part 44 in a state where the cover 30 and the case 40 are combined as described above is less than the thickness of the first heat dissipation sheet 61 in the natural state. For example, in a state where the cover 30 and the case 40 are combined, the gap in the opposing direction X between the first power-feeding element 11 and the first heat dissipation part 44 is about 0.3 mm. On the other hand, the thickness of the first heat dissipation sheet 61 in the natural state is, for example, about 0.5 mm. In such a dimensional relationship, the thickness of the first heat dissipation sheet 61 is decreased by about 0.2 mm as a result of compression.

The fixing screws SC3 fix the second substrate 20 to the case 40. As shown in FIG. 3, the case 40 according to the present embodiment includes a plurality (four in the example shown in the drawing) of second fixing holes H3$b$. Each second fixing hole H3$b$ penetrates the case 40 in the opposing direction X. The fixing screw SC3 is inserted through each second fixing hole H3$b$. In the present embodiment, the four second fixing holes H3$b$ one-to-one correspond to the four pedestal portions 46, and one second fixing hole H3$b$ opens at each pedestal portion 46. As shown in FIG. 3, each second fixing hole H3$b$ has an elongated hole shape.

As shown in FIG. 2, the second substrate 20 includes first fixing holes H3$a$ into which the fixing screws SC3 are inserted. Although detailed illustrations are omitted, the second substrate 20 includes the same number of the first fixing holes H3$a$ as that of the second fixing holes H3$b$. The positions of the first fixing holes H3a correspond to the positions of the second fixing holes H3b. A through-hole tap 23 is disposed at each first fixing hole H3a. The through-hole tap 23 is a cylindrical member fixed to the first fixing hole H3a. The inner peripheral surface of the through-hole tap 23 is provided with a spiral groove that threadably engages with the outer peripheral surface of the screw portion SCa.

When the second substrate 20 is fixed to the case 40, the screw portion SCa of the fixing screw SC3 is inserted through the second fixing hole H3b and is screwed into the through-hole tap 23. Then, the head portion SCb of the fixing screw SC3 eventually comes into contact with the case 40. When the fixing screw SC3 is further screwed, the screw portion SCa presses the second substrate 20 against the case 40 through the through-hole tap 23. The pressing force fixes the second substrate 20 to the case 40.

In a state where the first substrate 10, the second substrate 20, the cover 30, and the case 40 are fixed to each other as described above, parts other than the antennas A and the external terminal 22 among parts provided in the first substrate 10 or the second substrate 20 are covered by the housing C when viewed in the opposing direction X. That is, parts other than the antennas A and the external terminal 22 among parts provided in the first substrate 10 or the second substrate 20 are positioned between the case 40 and the cover 30 in the opposing direction X and overlap both of the case 40 and the cover 30 when viewed in the opposing direction X. This configuration can make it difficult to modify the wireless module 1. Modification to the wireless module 1 may be made more difficult by using security screws for the screws SC1 to SC3. The "parts other than the antennas A and the external terminal 22 among parts provided in the first substrate 10 or the second substrate 20" include, for example, the first power-feeding element 11, the second power-feeding element 21, or peripheral components (a power IC, a memory, a crystal oscillator or the like) mounted on the substrates 10 and 20.

Figure 7:
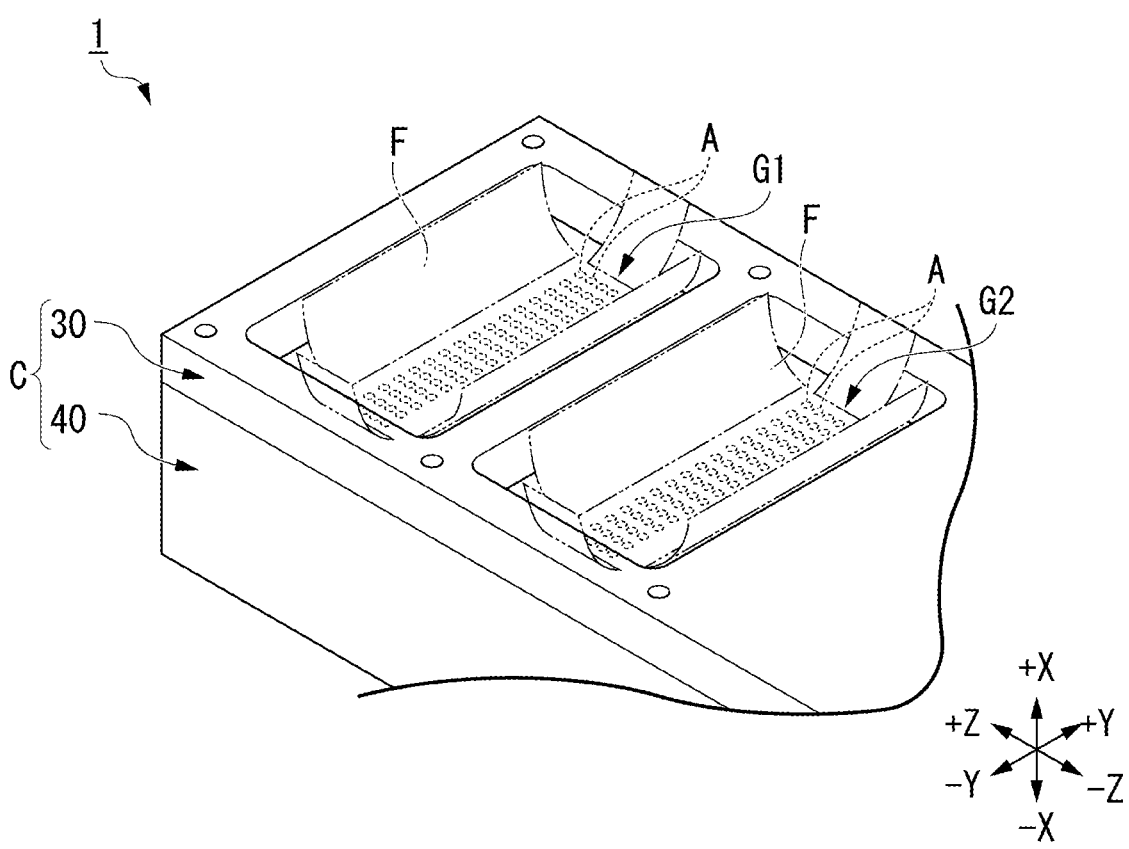
FIG. 7 is a diagram showing a preferable positional relationship between an antenna and a passing section.
Figure 8:
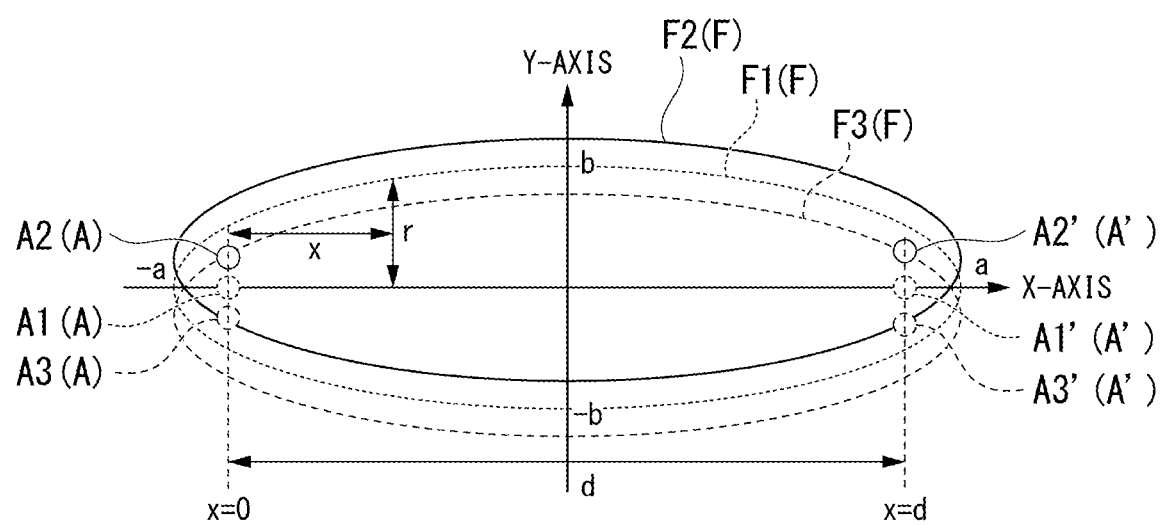
FIG. 8 is a diagram showing a Fresnel zone.

Next, a preferable positional relationship between the passing sections 31 and the antennas A is described based on FIGS. 7 and 8.

As described above, the passing sections 31 are sections that prevent electromagnetic waves from electromagnetically interfering with the cover 30. Here, in order to limit electromagnetic interference between the cover 30 and the electromagnetic waves that the antennas A transmit and receive to more reliably limit the deterioration of wireless performance of the wireless module 1, it is preferable that the antennas A and the passing sections 31 have the positional relationship shown in FIG. 7. That is, the passing sections 31 are preferably provided such that the Fresnel zone F of the antennas A and the cover 30 (for example, the beam portion 30b) do not interfere with each other.

The Fresnel zone F is defined as a region (i.e., a region where the phase difference is less than or equal to 180°) where the path difference is less than or equal to half a wavelength when the electromagnetic waves propagate from the transmission point to the reception point. FIG. 8 is a graph depicting the Fresnel zone F on two-dimensional plane coordinates. In FIG. 8, antennas A1 to A3 correspond to the antennas A that the wireless module 1 includes. Antennas A1' to A3' correspond to antennas A' that are disposed on the outside of the wireless module 1 and that transmit and receive electromagnetic waves to and from the antennas A of the wireless module 1. The Fresnel zone F is calculated for each pair of the antenna A and the antenna A'. For example, a Fresnel zone F1 shown in FIG. 8 is the Fresnel zone F calculated for the pair of the antenna A1 and the antenna A1', and a Fresnel zone F2 is the Fresnel zone F calculated for the pair of the antenna A2 and the antenna A2'. A Fresnel zone F3 is the Fresnel zone F calculated for the pair of the antenna A3 and the antenna A3', An X-axis in FIG. 8 corresponds to the opposing direction X of the wireless module 1. A Y-axis corresponds to a direction (for example, the first direction Y or the second direction Z of the wireless module 1) orthogonal to the opposing direction X. That is, a case is assumed that the wireless module 1 transmits electromagnetic waves toward the front side (+X side) and receives electromagnetic waves from the front side (+X side). Each value shown in FIG. 8 is defined as follows.

d: Distance between transmission point and reception point (transmission-reception point distance) [m]
　a: Ellipse major axis [m]
　b: Ellipse minor axis [m]
　x: Coordinates based on transmission point (location coordinates based on transmission point) [m]
　r: Fresnel radius [m]

The relationships shown in the following formulas (1) to (3) hold true for the above values. $\lambda$ [m] denotes the wavelength of the electromagnetic waves that the antennas A and A' transmit and receive.

$$r = b\sqrt{1 - \left(\frac{x}{a}\right)^2} \tag{1}$$

$$a = \frac{1}{2}d + \frac{1}{2}\lambda \tag{2}$$

$$b = \frac{1}{2}\sqrt{\frac{1}{4}\lambda + \lambda d} \tag{3}$$

Here, the transmission-reception point distance d is a value that varies depending on the position of the antenna A' provided on the outside of the wireless module 1. As can be seen from the formulas (1) to (3), as the antenna A' is away from the antenna A (that is, as the transmission-reception point distance d increases), the Fresnel radius r of the Fresnel zone F increases. That is, it is necessary to increase the size of the passing section 31.

After intensive study by the inventors of the present application, it was found that in a case of the wireless module 1 in 60 GHz band, the Fresnel radius r in the vicinity of the wireless module 1 does not substantially change when the transmission-reception point distance d is 0.5 m or more. Specifically, when focusing on the area (for example, the range of 0 [mm]≤x≤6 [mm]) where the cover 30 exists, it was found that the Fresnel radius r does not substantially change even if the transmission-reception point distance d is changed to 0.5 m or more.

Therefore, it is desirable to determine the size and position of the passing section 31 in consideration of the Fresnel zone F of the antenna A in a case where the transmission-reception point distance d is set to 0.5 m or more. The wireless module 1 according to the present embodiment includes the plurality of antennas A. Accordingly, it is desirable to calculate the Fresnel zone F for each antenna A and to determine the size and position of the passing section 31 such that all of the calculated Fresnel zones F do not interfere with the cover 30. In the example shown in the drawings, it is sufficient to calculate the Fresnel zones F for the antennas A positioned at the outermost periphery of each of the antenna groups G1 and G2.

The wireless module 1 may transmit and receive electromagnetic waves in a direction tilted to the opposing direction X. In view of this, the size and position of the passing section 31 may be determined in consideration of, for example, the Fresnel zone F calculated by tilting the X-axis shown in FIG. 8 at a predetermined angle (for example, 45°) with respect to the opposing direction X of the wireless module 1. In this case, it is possible to more reliably limit the interference of the electromagnetic waves.

Next, an example of a method of assembling the wireless module 1 according to the present embodiment is described based on FIGS. 9A to 9E.

Figure 9A:
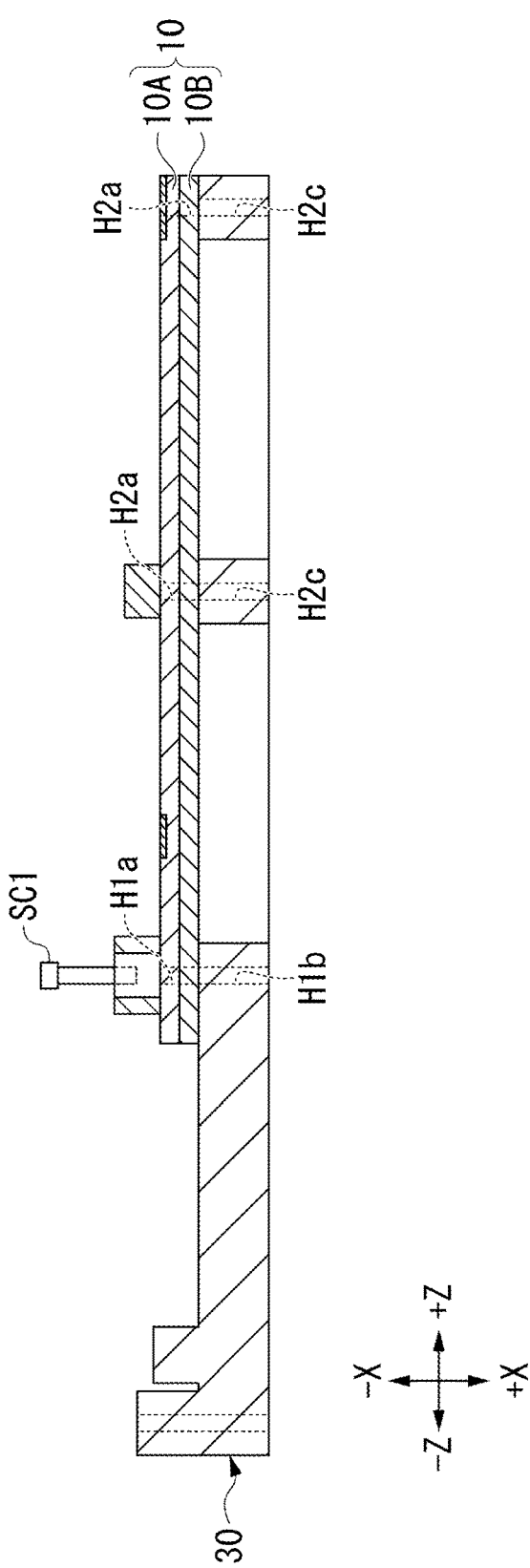
FIG. 9A is a diagram showing an example of a method of assembling the wireless module according to the embodiment of the present disclosure.

First, the cover 30 is placed on a workbench or the like. At this time, as shown in FIG. 9A, the front side (+X side) of the cover 30 is directed downward in the gravity direction. Next, the first substrate 10 is placed on the cover 30 such that the reinforcement part 10B faces downward in the gravity direction. At this time, the positioning holes H1*a* are made to overlap the first screw holes H1*b* in the opposing direction X, and the avoidance portions H2*a* are made to overlap the second screw holes H2*c* in the opposing direction X. Then, the positioning screws SC1 are inserted through the positioning holes H1*a* and are screwed into the first screw holes H1*b*. As a result, the first substrate 10 is positioned and fixed to the cover 30.

Figure 9B:
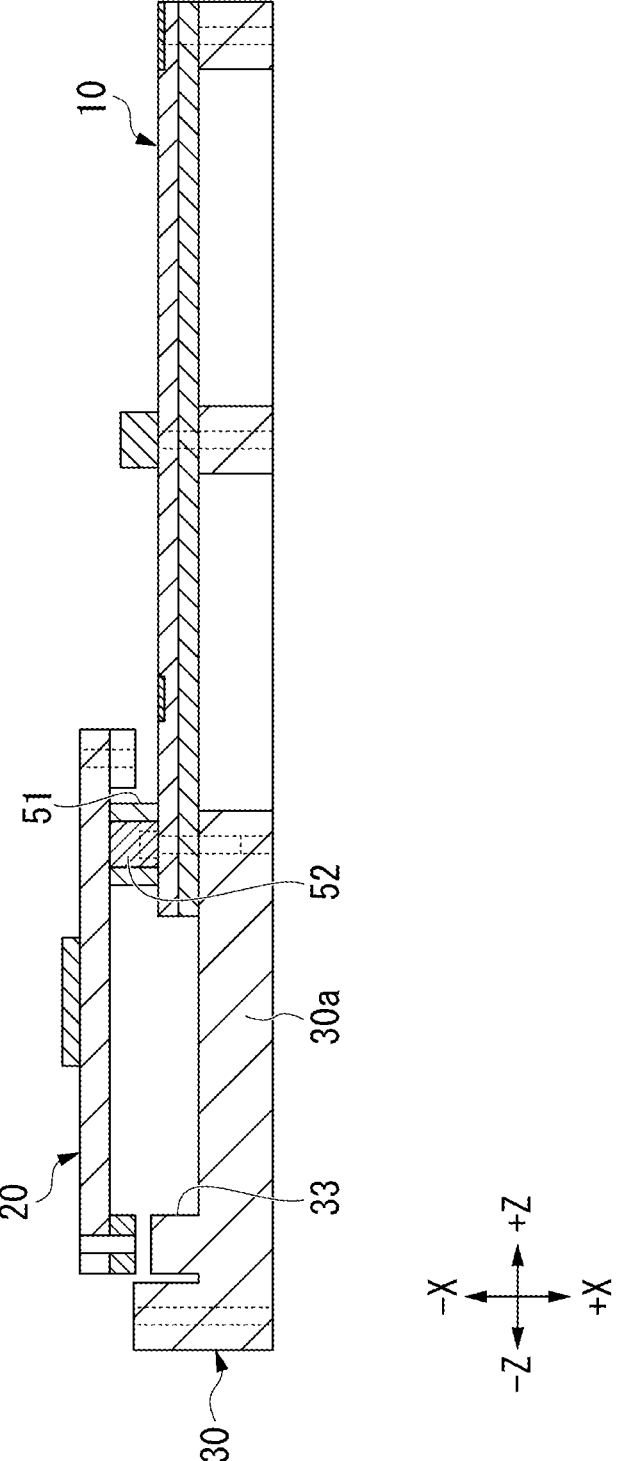
FIG. 9B is a diagram showing a state following FIG. 9A.

Next, as shown in FIG. 9B, the first substrate 10 and the second substrate 20 are electrically connected together through the connectors 51 and 52. At this time, the second substrate 20 may be tilted due to the influence of gravity. Therefore, as shown in FIG. 9B, the cover 30 may include a support portion 33 that limits the second substrate 20 from tilting. The support portion 33 is, for example, a protrusion that protrudes from the plate portion 30*a* of the cover 30 toward the back side (−X side).

Figure 9C:
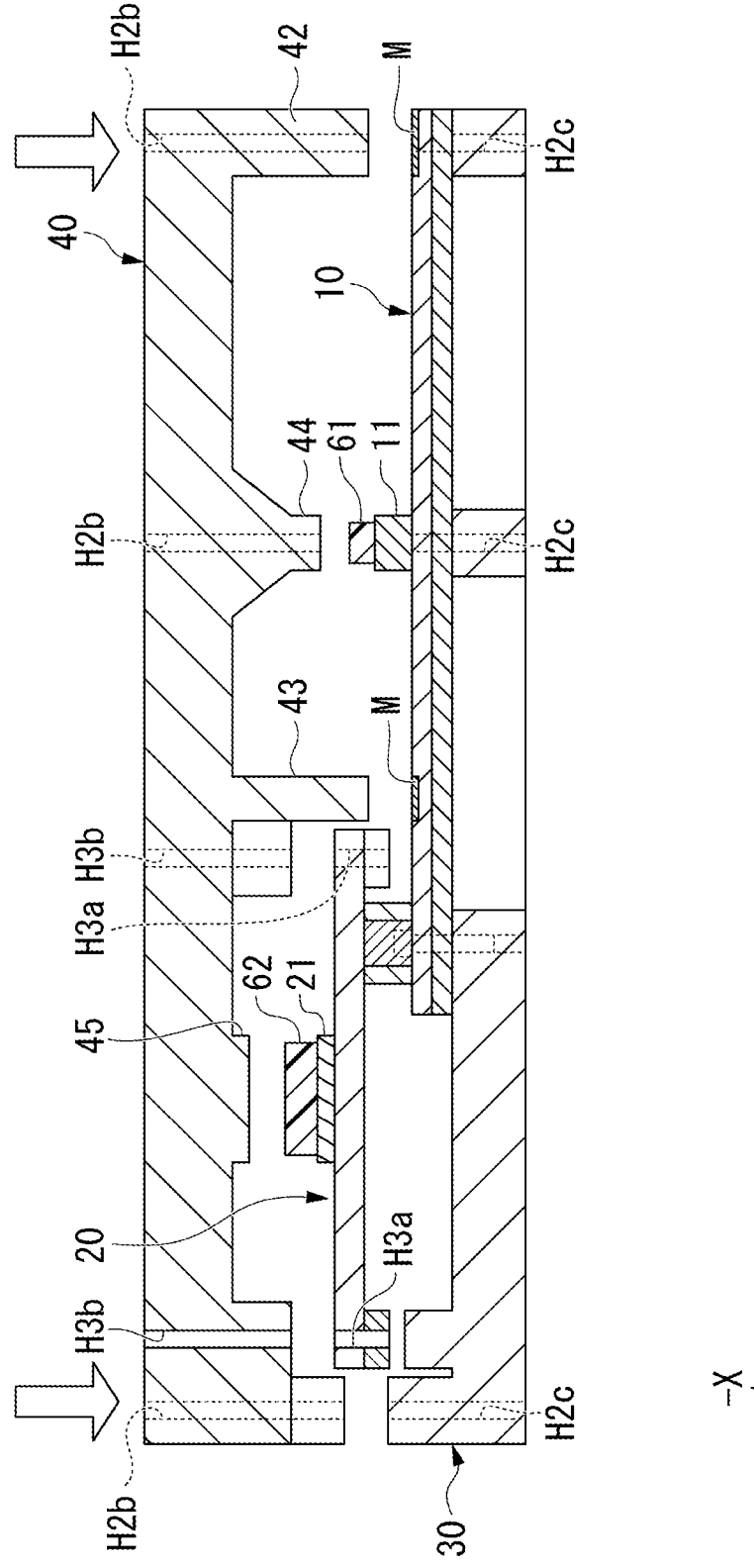
FIG. 9C is a diagram showing a state following FIG. 9B.

Next, as shown in FIG. 9C, the first heat dissipation sheet 61 is placed on the first power-feeding element 11, and the second heat dissipation sheet 62 is placed on the second power-feeding element 21. Specifically, the first heat dissipation sheet 61 is fixed onto the first power-feeding element 11, and the second heat dissipation sheet 62 is fixed onto the second power-feeding element 21. Then, the case 40 is placed on the substrates 10, 20, and the cover 30. At this time, the peripheral wall portion 42 and the partition portion 43 are brought into contact with the metal portion M exposed on the surface of the first substrate 10. The first heat dissipation part 44 is brought into contact with the first heat dissipation sheet 61, and the second heat dissipation part 45 is brought into contact with the second heat dissipation sheet 62. The through-holes H2*b* are made to overlap the second screw holes H2*c* in the opposing direction X, and the second fixing holes H3*b* are made to overlap the first fixing holes H3*a* in the opposing direction X.

Figure 9D:
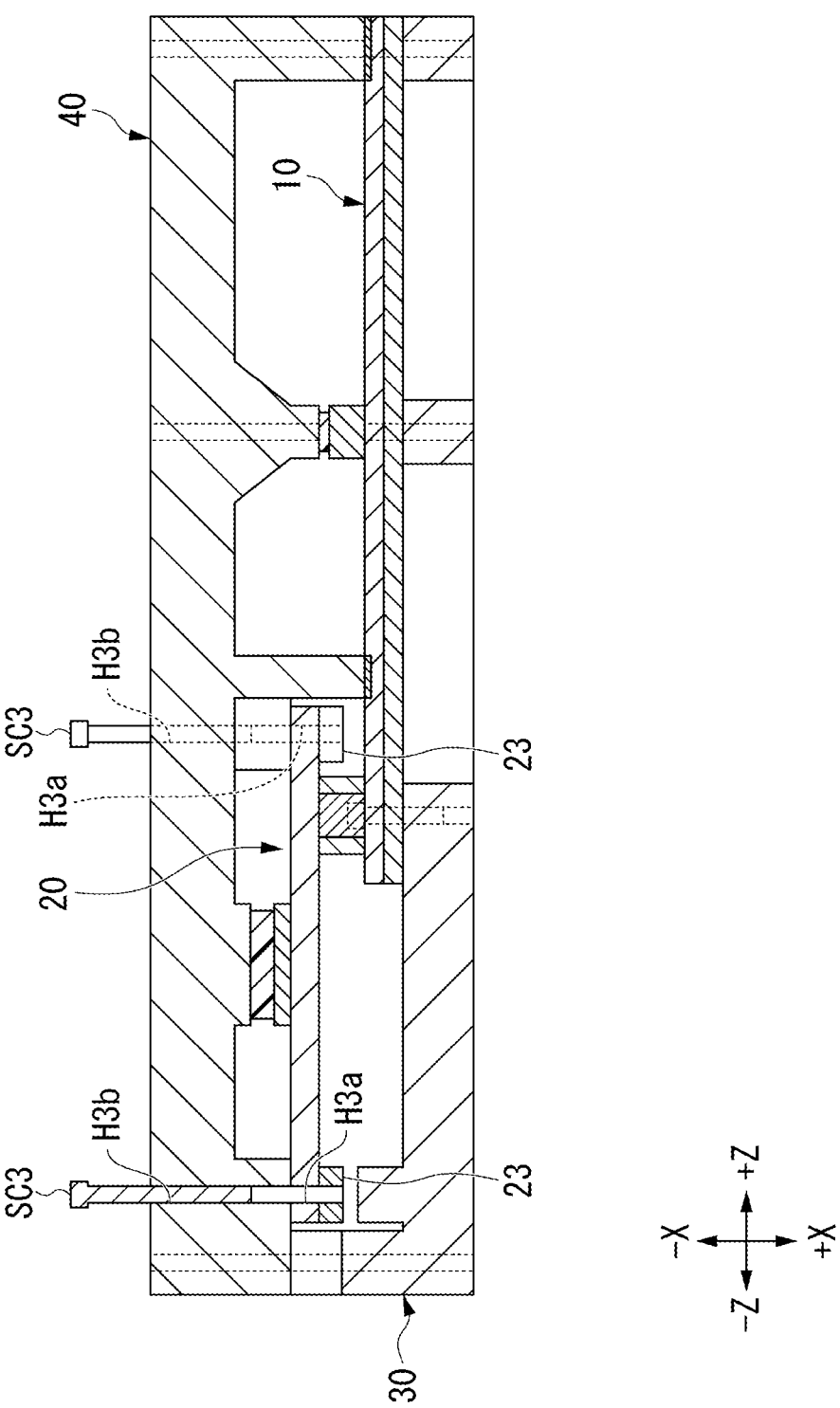
FIG. 9D is a diagram showing a state following FIG. 9C.

Next, as shown in FIG. 9D, the fixing screws SC3 are inserted through the second fixing holes H3*b* and are screwed into the through-hole taps 23 disposed at the first fixing holes H3*a*. As a result, the second substrate 20 is fixed to the case 40.

For example, depending on the assembly accuracy of the connectors 51 and 52, when the substrates 10 and 20 have been connected together through the connectors 51 and 52, the position and orientation of the second substrate 20 may deviate from desired position and orientation. Since the second fixing holes H3*b* have elongated hole shapes as described above, even if the position and orientation of the second substrate 20 deviate, the second substrate 20 can be fixed to the case 40 without affecting the position or the like of the first substrate 10.

Figure 9E:
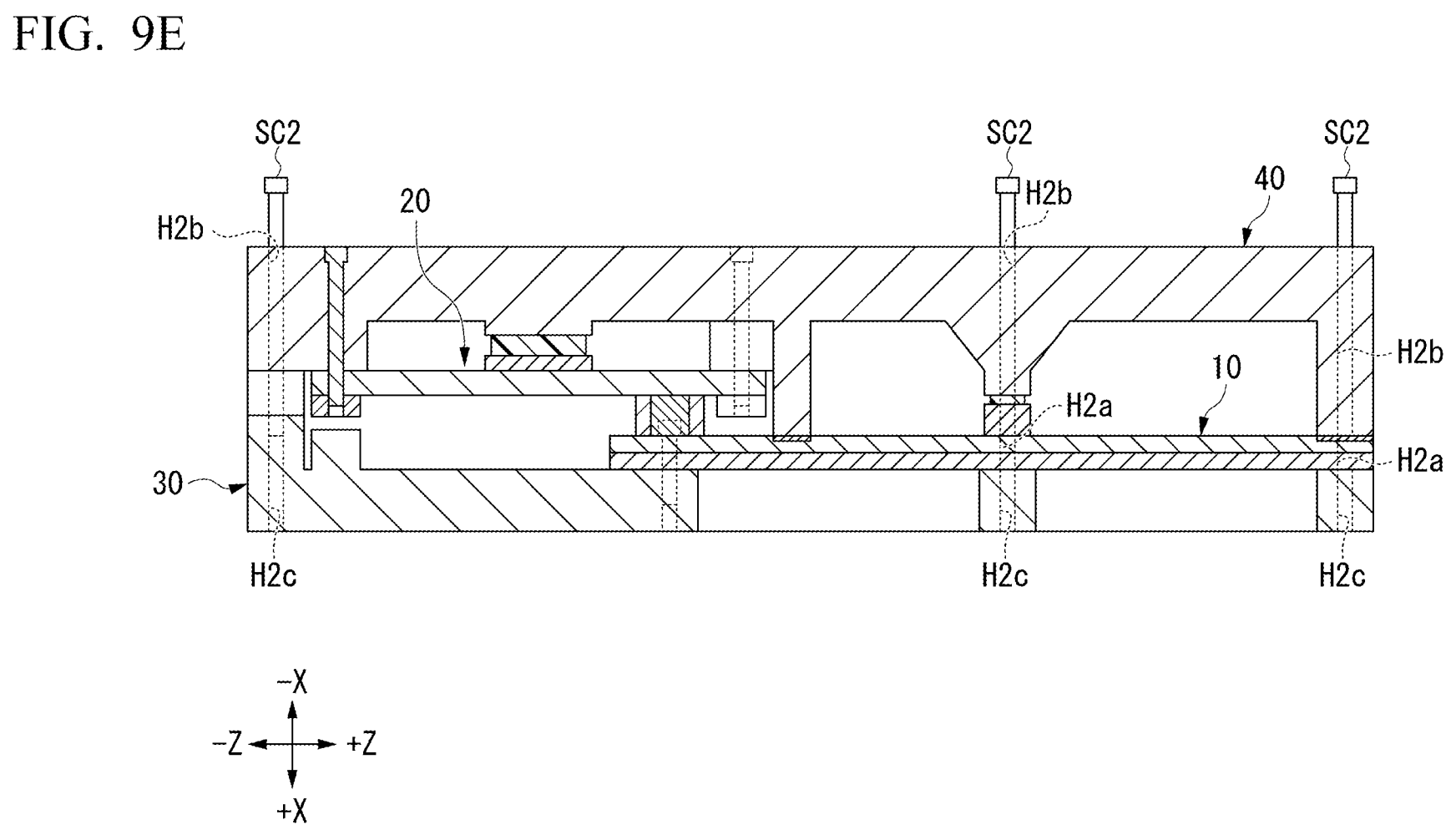

Finally, as shown in FIG. 9E, the through screws SC2 are inserted through the through-holes H2*b* and are screwed into the second screw holes H2*c*. As a result, the case 40 is fixed to the cover 30. The pressing force of the case 40 more firmly fixes the first substrate 10 to the cover 30. Since the first substrate 10 is provided with the avoidance portions H2*a* as described above, the structural interference between the through screws SC2 and the first substrate 10 can be easily avoided. The screw portion SCa of the through screw SC2 is screwed into the second screw hole H2*c*, and the head portion SCb presses the case 40, so that the cover 30 and the first heat dissipation part 44 of the case 40 compress the first heat dissipation sheet 61 and the first substrate 10 in the opposing direction X. Through the above steps, the assembly of the wireless module 1 is completed.

As a result of making the area of the tip surface (i.e., front side end surface, +X side end surface) of the first heat dissipation part 44 (i.e., the contact portion 44*a*) be greater than the area of the first heat dissipation sheet 61 in plan view as described above, the following effects can be obtained in the above assembly process. That is, even if the position of the case 40 is shifted in a direction (i.e., the first direction Y and the second direction Z) crossing the opposing direction X, the first heat dissipation sheet 61 and the first heat dissipation part 44 can be brought into contact with each other. Similarly, as a result of making the area of the tip surface (i.e., front side end surface, +X side end surface) of the second heat dissipation part 45 be greater than the area of the second heat dissipation sheet 62 in plan view, the following effects can be obtained. That is, even if the position of the case 40 is shifted in a direction (i.e., the first direction Y and the second direction Z) crossing the opposing direction X, the second heat dissipation sheet 62 and the second heat dissipation part 45 can be brought into contact with each other.

As described above, the wireless module 1 according to the present embodiment includes: the first substrate 10 including the antenna A that transmits and receives high-frequency signals in the millimeter-wave band, the first power-feeding element (first high-temperature element) 11 that supplies high-frequency signals to the antenna A being mounted on the first substrate 10; and the housing C including the cover 30 and the case 40 combined with each other and housing the first substrate 10, the cover 30 is provided with the passing section 31 allowing electromagnetic waves that the antenna A transmits and receives to pass therethrough, the first substrate 10 is in contact with the cover 30 in the opposing direction X in which the case 40 and the cover 30 oppose each other, the case 40 includes the first heat dissipation part 44 protruding toward the first power-feeding element 11 (front side, +X side), the first heat dissipation sheet 61 is provided between the first heat dissipation part 44 and the first power-feeding element 11 in the opposing direction X, and the cover 30 and the first heat dissipation part 44 compress the first heat dissipation sheet 61 and the first substrate 10 in the opposing direction X.

According to this configuration, when the first heat dissipation sheet 61 is made thinner and even if the positional relationship between the first substrate 10 and the housing C varies due to warping of the first substrate 10 or the like, the compression force of the cover 30 and the case 40 can bring the first heat dissipation sheet 61 into contact with the first power-feeding element 11 and the first heat dissipation part 44. As a result, the first heat dissipation sheet 61 can dissipate heat from the first power-feeding element 11 to the case 40.

Parts other than the first power-feeding element 11 among parts provided in the first substrate 10 do not dissipate heat to the case 40. When parts other than the first power-feeding element 11 dissipate heat to the case 40, for example, it is necessary to provide convex structures such as the first heat dissipation part 44 in positions corresponding to the parts. However, if such convex structures exist, depending on the degree of variation in heights (in the opposing direction X) of the convex structures, the first heat dissipation sheet 61 may be away from the first power-feeding element 11 or the first heat dissipation part 44. Among parts provided in the first substrate 10, the first power-feeding element 11 is the only part that dissipates heat to the case 40, thereby eliminating such a possibility and more reliably performing heat dissipation of the first power-feeding element 11.

In the present embodiment, no heat transfer members, which transfer heat from parts other than the first power-feeding element 11 among parts provided in the first substrate 10 to the case 40, are provided between the case 40 and the parts other than the first power-feeding element 11 among the parts provided in the first substrate 10 in the opposing direction X. It is conceivable that the heat transfer members are convex structures such as the first heat dissipation part 44, heat dissipation sheets, or the like. If such heat transfer members are provided, depending on the degree of variation in heights of the heat transfer members in the opposing direction X, the first heat dissipation sheet 61 may be away from the first power-feeding element 11 or the first heat dissipation part 44, but the heat transfer member are not provided in the present embodiment, so the first heat dissipation sheet 61 can be brought into appropriate contact with the first power-feeding element 11 and the first heat dissipation part 44.

The cover 30 and the case 40 are made of metal. According to this configuration, the heat capacity of the housing C can be increased, and the heat dissipation efficiency from the first power-feeding element 11 can be improved. The housing C (i.e., the cover 30 and the case 40) made of metal can shield the first power-feeding element 11, and unnecessary radiation can be blocked.

The first power-feeding element 11 is surrounded by the case 40 and the GND of the first substrate 10. According to this configuration, the GND of the first substrate 10 and the case 40 can shield the first power-feeding element 11, and unnecessary radiation can be blocked.

The area of the first heat dissipation sheet 61 may be less than the area of the first power-feeding element 11 when viewed in the opposing direction X. According to this configuration, an excessive stress is less likely to be applied to the terminal 14a (refer to FIG. 5) positioned in the outer edge portion of the first power-feeding element 11.

The area of the tip surface of the first heat dissipation part 44 (i.e., the contact portion 44a) may be greater than the area of the first heat dissipation sheet 61 when viewed in the opposing direction X. According to this configuration, even if the position of the case 40 is shifted in a direction (i.e., the first direction Y and the second direction Z) crossing the opposing direction X, the first heat dissipation sheet 61 and the first heat dissipation part 44 can be brought into contact with each other.

The first heat dissipation part 44 includes the tapered portion 44b having a tapered shape in which the cross-sectional area thereof gradually decreases in a direction from the case 40 (i.e., back side, −X side) toward the first power-feeding element 11 (i.e., front side, +X side). According to this configuration, it is possible to limit the volume of the first heat dissipation part 44 and to reduce the weight of the first heat dissipation part 44 while the heat dissipation efficiency is maintained. If the case 40 is manufactured through die-casting, reducing the volume of the first heat dissipation part 44 leads to advantages such as reducing manufacturing costs or the like.

A portion (e.g., the beam portion 30b) of the cover 30 that is in contact with the first substrate 10 does not interfere with the Fresnel zone F of the antenna A. According to this configuration, it is possible to limit the electromagnetic waves that the antenna A transmits and receives from interfering with the cover 30.

The first heat dissipation sheet 61 may have a radio wave-absorbing property. In this case, unnecessary radiation from the first power-feeding element 11 is less likely to leak to the outside of the wireless module 1.

The first heat dissipation sheet 61 may have a radio wave-absorbing property in a range from the centimeter-wave band to the millimeter-wave band. In this case, unnecessary radiation from the first power-feeding element 11 is further prevented from leaking to the outside of the wireless module 1.

The wireless module 1 according to the present embodiment further includes the second substrate 20 that handles baseband signals having a lower frequency than that of the high-frequency signals, and the housing C houses the first substrate 10 and the second substrate 20. According to the wireless module 1 having the above characteristics, even if the housing C houses the second substrate 20 in addition to the first substrate 10, it is possible to make the first heat dissipation sheet 61 thinner.

The second power-feeding element (second high-temperature element) 21 that supplies baseband signals to the first power-feeding element 11 is mounted on the second substrate 20, the case 40 includes the second heat dissipation part 45 protruding toward the second power-feeding element 21 (i.e., front side, +X side), and the second heat dissipation sheet 62 is provided between the second heat dissipation part 45 and the second power-feeding element 21 in the opposing direction X. According to this configuration, it is possible to dissipate heat from the second power-feeding element 21 to the case 40.

The second heat dissipation sheet 62 may be thicker than the first heat dissipation sheet 61. According to this configuration, even if the positional relationship between the second substrate 20 and the housing C varies due to warping of the second substrate 20 or the like, it is possible to bring the second heat dissipation sheet 62 into contact with the second power-feeding element 21 and the second heat dissipation part 45.

The first substrate 10 is fixed to the cover 30, and the second substrate 20 is fixed to the case 40. According to this configuration, compared to, for example, a case where both of the first substrate 10 and the second substrate 20 are fixed to the cover 30 (or the case 40), the degree of freedom in design of the wireless module 1 can be improved. More specifically, it is possible to provide the positioning hole H1a and the first fixing hole H3a in portions of the first substrate 10 and the second substrate 20 that overlap each other in the opposing direction X.

The second substrate 20 is provided with the external terminal 22, parts other than the antenna A and the external terminal 22 among parts provided in the first substrate 10 or the second substrate 20 are positioned between the case 40 and the cover 30 in the opposing direction X, and parts other than the antenna A and the external terminal 22 among parts provided in the first substrate 10 or the second substrate 20 overlap both of the case 40 and the cover 30 when viewed in the opposing direction X. This configuration can make it difficult to modify the wireless module 1.

The technical scope of the present disclosure is not limited to the above embodiment, and various modifications can be adopted within the scope of the present disclosure.

For example, in the above embodiment, the positioning hole H1a is disposed in the vicinity of the first connector 51 (refer to FIG. 4), but the position of the positioning hole H1a can be changed as appropriate. For example, the positioning hole H1a may be disposed in the vicinity of the antenna A and may be disposed in the diagonal line of the first substrate 10. According to these configurations, the shift and rotation of the first substrate 10 relative to the cover 30 can be further limited.

In the above embodiment, the metal portion M and the case 40 are in mechanical and electrical contact with each other (refer to FIG. 2), but the metal portion M and the case 40 may not be in mechanical contact with each other as long as the metal portion M and the case 40 are in electrical contact with each other. For example, a conductive sheet that comes into mechanical and electrical contact with both of the metal portion M and the case 40 may be provided therebetween.

In the above embodiment, the second fixing holes H3b are provided in the case 40, but the second fixing holes H3b may be provided in the cover 30. In other words, the second substrate 20 may be fixed to the cover 30. However, if the second fixing hole H3b has an elongated hole shape, unnecessary radiation may leak from a gap between the second fixing hole H3b and the fixing screw SC3. For this reason, it is desirable that the second fixing hole H3b having an elongated hole shape is provided in the case 40 rather than in the cover 30.

The second fixing hole H3b may not have an elongated hole shape. In this case, the first fixing hole H3a may have an elongated hole shape. However, if the first fixing hole H3a has an elongated hole shape, the size of the first substrate 10 may be increased. Therefore, it is desirable that the first fixing hole H3a does not have an elongated hole shape but the second fixing hole H3b has the shape.

The housing C (i.e., the cover 30 and the case 40) may not be made of metal. For example, the housing C may be made of resin or the like. If the housing C is made of resin, the cover 30 may not be provided with an opening used as the passing section 31. In this case, the passing section 31 may be the cover 30 itself.

In the above embodiment, the first substrate 10 and the second substrate 20 are provided in the wireless module 1, but the second substrate 20 may not be provided therein, and only the first substrate 10 may be provided in the wireless module 1. In this case, the second power-feeding element 21, the external terminal 22 and the like may be provided in the first substrate 10.

In the above embodiment, the two passing sections 31 are provided in the cover 30, but only one or three more passing sections may be provided in the cover 30.

Within the scope of the present disclosure, the components of the above embodiment can be appropriately replaced with well-known components, and the above embodiment and modifications may be appropriately combined together.

What is claimed is:

1. A wireless module, comprising:
a first substrate including an antenna that transmits and receives high-frequency signals in a millimeter-wave band, a first high-temperature element that supplies high-frequency signals to the antenna being mounted on the first substrate; and a housing including a cover and a case combined with each other and housing the first substrate, wherein
the cover is provided with a passing section allowing electromagnetic waves that the antenna transmits and receives to pass therethrough,
the first substrate is in contact with the cover in an opposing direction in which the case and the cover oppose each other,
the case includes a first heat dissipation part protruding toward the first high-temperature element,
a first heat dissipation sheet is provided between the first heat dissipation part and the first high-temperature element in the opposing direction,
the cover and the first heat dissipation part compress the first heat dissipation sheet and the first substrate in the opposing direction, and
the first high-temperature element is provided between the first heat dissipation sheet and the first substrate in the opposing direction.

2. The wireless module according to claim 1, wherein no heat transfer members are provided between the case and parts other than the first high-temperature element among parts provided in the first substrate in the opposing direction.

3. The wireless module according to claim 1, wherein the cover and the case are made of metal.

4. The wireless module according to claim 3, wherein the first high-temperature element is surrounded by the case and a GND of the first substrate.

5. The wireless module according to claim 1, wherein an area of the first heat dissipation sheet is less than an area of the first high-temperature element when viewed in the opposing direction.

6. The wireless module according to claim 1, wherein an area of a tip surface of the first heat dissipation part is greater than an area of the first heat dissipation sheet when viewed in the opposing direction.

7. The wireless module according to claim 1, wherein the first heat dissipation part includes a tapered portion having a tapered shape in which a cross-sectional area thereof gradually decreases in a direction from the case toward the first high-temperature element.

8. The wireless module according to claim 1, wherein a portion of the cover that is in contact with the first substrate does not interfere with a Fresnel zone of the antenna.

9. The wireless module according to claim 1, wherein the first heat dissipation sheet has a radio wave-absorbing property.

10. The wireless module according to claim 1, further comprising
a second substrate that handles baseband signals having a lower frequency than that of the high-frequency signals, wherein
the housing houses the first substrate and the second substrate.

11. The wireless module according to claim 10, wherein a second high-temperature element that supplies baseband signals to the first high-temperature element is mounted on the second substrate,
the case includes a second heat dissipation part protruding toward the second high-temperature element, and
a second heat dissipation sheet is provided between the second heat dissipation part and the second high-temperature element in the opposing direction.

12. The wireless module according to claim 11, wherein the second heat dissipation sheet is thicker than the first heat dissipation sheet.

13. The wireless module according to claim 10, wherein the first substrate is fixed to the cover, and the second substrate is fixed to the case.

14. The wireless module according to claim 10, wherein the second substrate is provided with an external terminal, parts other than the antenna and the external terminal among parts provided in the first substrate or the second substrate are positioned between the case and the cover in the opposing direction, and parts other than the antenna and the external terminal among parts provided in the first substrate or the second substrate overlap both of the case and the cover when viewed in the opposing direction.

\* \* \* \* \*